United States Patent [19]

Daxinger et al.

[11] Patent Number: 5,733,419
[45] Date of Patent: Mar. 31, 1998

[54] VACUUM TREATMENT CHAMBER

[75] Inventors: Helmut Daxinger, Wangs; Walter Haag, Grabs, both of Switzerland

[73] Assignee: Balzers Aktiengesellschaft, Liechtenstein

[21] Appl. No.: 598,326

[22] Filed: Feb. 8, 1996

[30] Foreign Application Priority Data

Nov. 16, 1995 [CH] Switzerland .................. 03251/95

[51] Int. Cl.$^6$ .................. C23C 14/34; C23C 14/35
[52] U.S. Cl. .................. 204/192.12; 204/192.22; 204/192.23; 204/298.06; 204/298.08; 204/298.14
[58] Field of Search .................. 204/192.12, 192.22, 204/192.23, 298.06, 298.08, 298.14, 298.19

[56] References Cited

U.S. PATENT DOCUMENTS

| 3,514,391 | 5/1970 | Hablanian | 204/298.06 |
| 4,619,755 | 10/1986 | Hessberger et al. | 204/298.14 |
| 5,106,474 | 4/1992 | Dickey et al. | 204/298.14 |
| 5,403,458 | 4/1995 | Hartig et al. | 204/192.15 |

FOREIGN PATENT DOCUMENTS

| 222900 | 5/1985 | Germany | 204/298.14 |
| 52-7669 | 1/1977 | Japan | 204/298.14 |
| 5-230646 | 9/1993 | Japan | 204/298.14 |

Primary Examiner—Aaron Weisstuch
Attorney, Agent, or Firm—Evenson, McKeown, Edwards & Lenahan, P.L.L.C.

[57] ABSTRACT

A vacuum treatment chamber has a sputtering electrode and a counter electrode together defining a plasma discharge area. The counter electrode has an electrode surface area which is not visible from the sputtering electrode. A third electrode, together with the non-visible surface area, defines an auxiliary plasma discharge space. A substantially unencumbered propagative electron path is established between the discharge spaces. A plasma discharge is generated between the sputtering electrode and the counter electrode within a vacuum chamber.

19 Claims, 6 Drawing Sheets

VACUUM TREATMENT CHAMBER

BACKGROUND OF THE INVENTION

The present invention is directed to a vacuum treatment chamber which comprises a sputtering electrode and a counter electrode with respect to the sputtering electrode, the counter electrode defining together with the sputtering electrode a plasma discharge area. The present invention is further directed to a vacuum treatment process wherein a plasma discharge is generated between a sputtering electrode and a counter electrode within a vacuum chamber.

The present invention is still further directed to a magnetron sputtering source which comprises a sputtering electrode and a counter electrode with respect to the sputtering electrode.

In connection with the present invention, the sputtering electrode may be an electrode wherefrom material is sputtered-off to be deposited on a workpiece, which is the case in a sputter layer deposition technique. It may also be an electrode whereon, for sputter etching, workpieces are deposited.

The present invention is thereby primarily directed to techniques during which electrically isolating contaminating depositions are formed in the vacuum chamber. This may be the case when material is sputtered-off the sputtering electrode which has a lower electric conductivity than a metal or may be the case when the material sputtered-off the sputtering electrode reacts with a reactive gas within the chamber, and there is formed from such reaction a low conductivity or nonconductive insulating deposition.

In such cases the problem occurs that, due to formation of this contaminating insulation deposition at the counter electrode, the plasma discharge process maintained between the sputtering electrode and the counter electrode becomes more or less stochastically variable in time, i.e. unstable.

Whereas with Rf-sputtering techniques the growing insulation deposition on the electrode which is not sputtered, i.e. the counter electrode, which shall be named "anodic" electrode, leads to shifting of the DC-self bias potential of the discharge—due to varying capacitance of the layer formed along the anodic electrode—, the insulating deposition or layer on the anode leads in DC-sputtering to the problems that the discharge voltage increases and that the anode electrode loses more and more of its proper function. This is due to the DC-decoupling effect of the capacitative layer during DC-operation.

DC-sputtering, and predominantly reactive DC-sputtering, is today a preferred technique, e.g. because relatively low cost plants may be used compared with sputtering plants for Rf-sputtering.

In Rf-sputtering and DC-sputtering, the latter today being preferred, the anodic electrode (Rf) or the anode (DC) has to be cleaned frequently to ensure substantially time-invariant process conditions. This is obviously totally uneconomic, and by such attempts frequent problems occur with respect to contaminating the process chamber due to its frequent opening to the ambient. In magnetron sputtering sources which are preferably used for DC-sputtering due to their high sputtering rate, this problem is especially significant.

It is obvious that the above-mentioned formation of contaminating insulative deposition also occurs at the sputtering electrode.

This is the case in which electrically low conductive material is sputtered or in cases in which electrically conductive material is sputtered, but into an atmosphere of reactive gas, wherein, by reaction of the sputtered-off material with the gas, electrically low conductive materials are formed. This problem, with respect to the electrode being sputtered, was already resolved especially when economically advantageous DC-discharge generators are used by superimposing on the DC-voltage for the plasma discharge a pulsating voltage, as is described in detail in EP-0 564 789. This is especially achieved by a relatively low cost choppering technique.

For DC-sputtering, the problem mentioned above and with respect to the anode was resolved up to now by increasing the anode surface area or by providing additional screens or labyrinths. Such screens or labyrinths were provided with the target to maintain electrically conductive surface areas of the anode, free from particles within the discharge, thereby making sure that a disturbing plasma discharge may not be generated in such areas by maintaining the distances between rigid surfaces at or below the dark space distance. Further, such screens and labyrinths were arranged so that electrons could find a low ohmic propagation path onto free conductive surface areas of the anodes, in spite of the contaminating insulative deposition at surface areas of the counter electrode exposed to the sputtering plasma discharge.

In FIG. 1a, the left-hand part of a typical magnetron sputtering arrangement is shown, according to the prior art, i.e without additional measures for keeping some of the anode surface free of contaminating isolation deposition. In FIG. 1a, the following reference numbers designate:

1: sputter target body,

2: frame for mounting the target body 1,

3: screws for mounting the fixating frame 2 and the target body 1,

4: thermally conductive contacting foil,

5: a cooling plate,

6: cooling channels for a cooling medium,

7: a frame-shaped anode,

8: a flange to the chamber wall for mounting the magnetron,

9: an electrical insulator between the cathode and the flange/anode,

10: a magnet system with magnet system frame 11,

12: magnetic field lines,

13: a gap.

At 13, there is shown, purely schematically and qualitatively, a contaminating insulation layer deposit which forms a distributed capacitance layer along anode 7. As may be seen, the discharge path between cathode and anode will ultimately be interrupted. It must also be considered that gap 14 between the anode 7 and the frame 2 is in fact realized to fulfill dark space conditions, so that no discharge will occur thereacross. Nevertheless, deposition particles may well penetrate into the gap and may, as shown, deposit on the anode and on parts of the mounting flange 8.

In FIG. 1b, prior art attempts shall be explained for resolving the problem described with respect to FIG. 1a. There is shown the right-hand part of a magnetron source, and the same reference numbers are applied for the elements already described in connection with FIG. 1a.

As may be seen from comparison of the two figures, the gap 14', which still fulfills dark space conditions, forms, due to its step-shaping, a labyrinthine path. Thereby, areas of the anode surface are shielded with respect to sputtered-off material. Thus, the effect is obtained that some anode surface area is not contaminated by insulating deposition and, kept free, leads to maintenance of the electrical discharge path. Electrons, which are attracted by the potential of the anode, propagate through the dark space gap 14' onto the anode surface area 15 kept free due to their very high mobility, so that the discharge current path is maintained uninterrupted.

It is further known to provide, instead of labyrinths as shown and described in FIG. 1b, so-called rim or screen arrangements which, on one hand, shield some areas of the anode surface and, on the other hand, increase the overall anode surface. Thereby, the uninterrupted covering of the anode surface with respect to the entire anode surface is prevented from occurring too quickly. Reference is made with respect to such approaches to the U.S. Pat. No. 3,514, 391, DE-A-34 27 587 and DE-A-36 12 721.

A significant drawback of these approaches is that it is not possible to realize operating conditions which are invariant in time just from the beginning of the sputtering operation. The continuous growth of the contaminating insulative deposition layer on the anode, which may not be prevented, continuously changes the discharge conditions. Even if shielding or labyrinth arrangements are provided, a relatively long time is required to reach stable operating conditions, because, from the beginning of operation, the effective surface area of the anode is caused to decrease.

Even after the shielded surface area of the anode exclusively contributes to the discharge current path, as a further drawback, the discharge voltage reached is relatively high due to the relatively long trajectory path along which the electrons must propagate.

High discharge voltages have the effect of increasing the occurrence frequency of flash-overs and of breakdowns which significantly harm the discharge process and destroy a desired layer formed by the sputter deposition process. The mere increase of the anode surface leads to a considerably longer time during which the discharge voltage increases because, in this case, the anode surface is continuously and steadily increasingly covered by the insulating layer deposition. Such unreproducible operating conditions, which have a deteriorating effect on the quality of layer deposition by a sputtering process, are not acceptable under the quality requirements encountered today. In this respect, we mention the most critical layer deposition processes for storage plates or for semiconductor structures.

SUMMARY OF THE INVENTION

It is an object of the present invention to provide a vacuum treatment chamber which comprises a sputtering electrode and a counter electrode defining together with the sputtering electrode a plasma discharge area which remedies the above mentioned drawbacks of the prior art and which allows sputtering of electrically low conductive materials up to dielectric materials without interferences, for instance without arcing, with high reproducibility, with a high degree of productivity and thus highly economically, and further with long operating times without any maintenance. Thereby, the sputtering process is rapidly stabilized.

This object is achieved by a vacuum treatment chamber which comprises a sputtering electrode and a counter electrode defining together with the sputtering electrode a primary plasma discharge space and wherein the counter electrode has an electrode surface area which is not visible from the sputtering electrode, which chamber further comprises a third electrode which defines, together with the surface area of the electrode not being visible from the sputtering electrode, an auxiliary discharge space, and wherein there is provided a substantially uncumbered propagation path for electrons between the primary plasma discharge space and the auxiliary plasma discharge space.

By the fact that there is inventively provided a third electrode and this electrode forms, with respect to the surface areas of the counter electrode which are not visible from the sputtering electrode, a discharge space—called an auxiliary space—, and this third electrode thus is distant from such space by more than the dark space distance, and further by the fact that an uncumbered propagation path for electrons is provided between the two discharge spaces, namely the discharge space between the third electrode and the invisible surface area of the counter electrode and the discharge space between the sputtering electrode and the counter electrode, the object is fulfilled that the anode surface area, free of contamination, is significantly increased in three dimensions by the electrically highly conductive auxiliary discharge in the auxiliary discharge space. Thereby, electrons from the primary discharge between the sputtering electrode and the counter electrode may easily propagate at any time along a low resistance path towards and onto the anode. This occurs in spite of the growth of a contaminating insulating deposition layer on the sputter-exposed anode surface areas which are visible from the sputtering electrode surface.

BRIEF DESCRIPTION OF THE DRAWINGS

The drawings show as examples:

FIG. 7 shows schematically, a further embodiment of a preferred inventive DC-sputtering chamber in a representation analogous to that of FIG. 6a;

DETAILED DESCRIPTION OF THE DRAWINGS

Figure 1A:
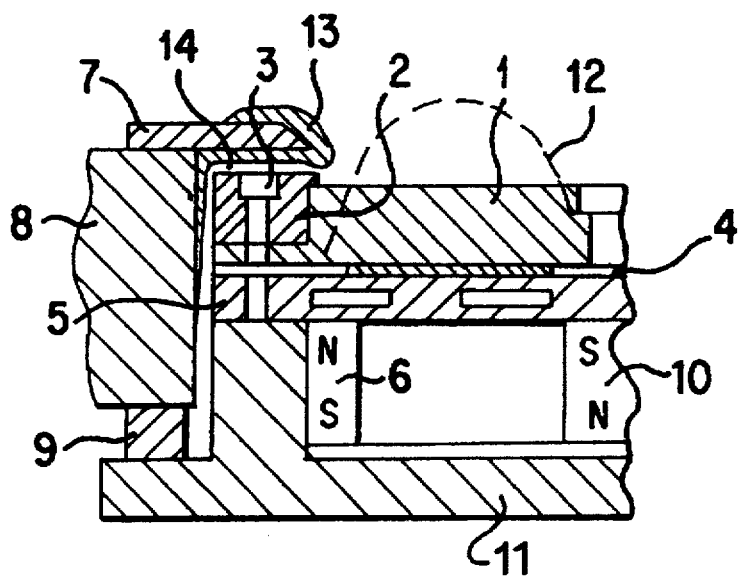
FIGS. 1a and 1b show prior art approaches which have already been described.
Figure 1B:
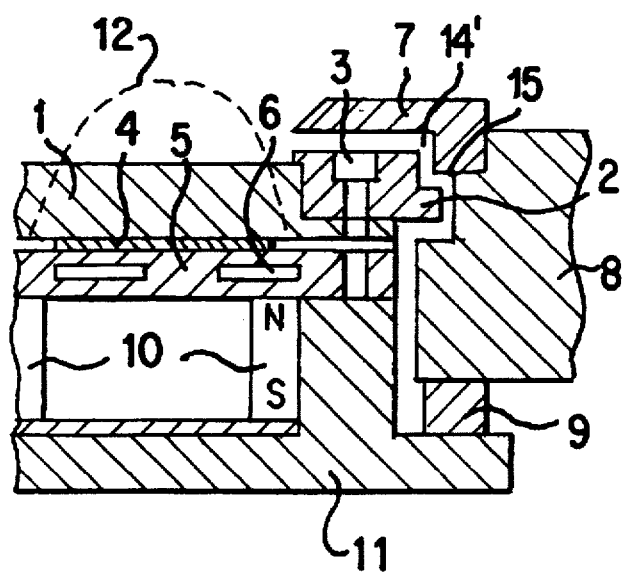
Figure 2:
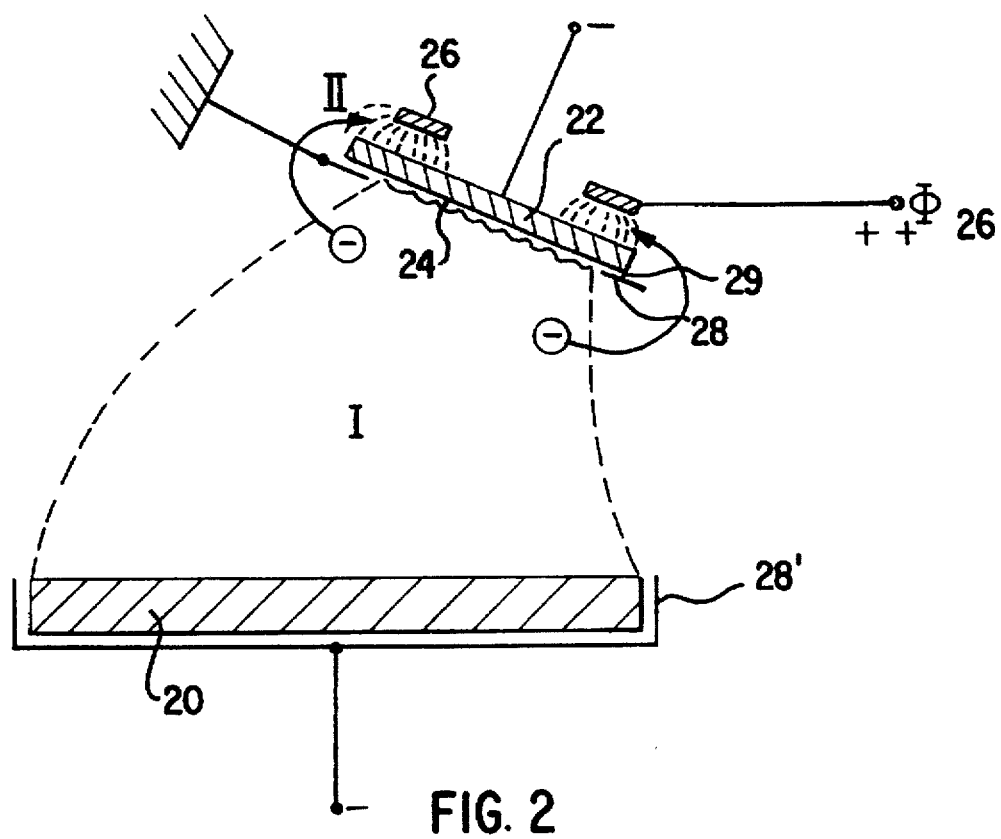
FIG. 2 shows purely schematically, the principle which is realized in an inventive vacuum treatment chamber or vacuum treatment process or at the inventive magnetron sputtering source.

In FIG. 2 a sputtering electrode 20 is shown, to which a cathodic electric potential is applied. Between the sputtering electrode 20 and a counter electrode 22, to which an anodic electric potential is applied, a primary plasma discharge I is generated in an atmosphere of a working gas, e.g. argon.

Target material at the electrode 20 is sputtered-off and is either of electrical low conductivity per se, i.e. of significantly lower conductivity than a metal or even a dielectric, or in the primary discharge I the material sputtered-off electrode 20 reacts with gas entering from a reactive gas inlet to the chamber, thereby forming a low conductive reaction product. In each case there is deposited on the anodic electrode 22 an insulating deposit 24. Remote from direct view from the sputtering electrode 20, there is provided a third electrode 26, which is shown ring-shaped as an example.

By means of a screen 28 or some part of the third electrode 26 itself, gaps 29 are formed which fulfil dark space conditions, thereby preventing generation of the discharge I on the reverse side of the electrode 22. Nevertheless, between the third electrode 26 and the anodic electrode 22 the distances are such that a further plasma discharge II may be generated and maintained, such further discharge being termed "auxiliary" discharge. As schematically shown by the one-sided provision of the dark space screen 28, there is realized a practically unobstructed trajectory path between primary discharge space I and auxiliary discharge space II. Thereby, the following conditions occur:

The reverse side of the anodic electrode 22 is kept free from contaminating insulating deposition.

The auxiliary discharge II forms a highly conductive electrical path between anodic electrode 22 and third electrode 26 and, considered in terms of equivalent electrical circuitry, there is thus formed a low ohmic electric connection between primary discharge space I and the conductive surface area of the anodic electrode 22.

Electrically parallel with respect to the contaminating insulating deposit 24, there is thus formed the highly conductive auxiliary discharge II, which latter short-circuits the contaminating insulating deposit 24.

As the auxiliary discharge II is very low ohmic (i.e., highly conductive), growing insulative deposits 24 are very quickly made ineffective; the electron current is maintained via the auxiliary discharge II which, in fact, significantly increases spatially the contamination-free surface of the anodic electrode 22.

The potential of the third electrode 26, shown $\Phi_{26}$ with respect to the potential of the anodic electrode 22 in the figure, is preferably anodic with respect to the potential of the anode electrode 22, so that for the auxiliary plasma discharge II the electrode 22, being anodic for primary discharge I, acts cathodically and is thereby sputter-etched.

In the above, we have referred to "anodic" and "cathodic" electrodes to include the case of an Rf-operated primary discharge I and possibly even an Rf-operated auxiliary discharge II.

If, according to the surface law of KOENIG, the surface area which is exposed to the primary discharge I is selected smaller than the surface area of electrode 22, then, during Rf-operation, there will result a cathodic potential at electrode 20 and an anodic potential at electrode 22 without defining these electrodes as anode and cathode by external DC-potential application. During the subsequent description, "anode" and "cathode" shall be understood even at pure Rf-considerations to have this meaning.

Figure 3:
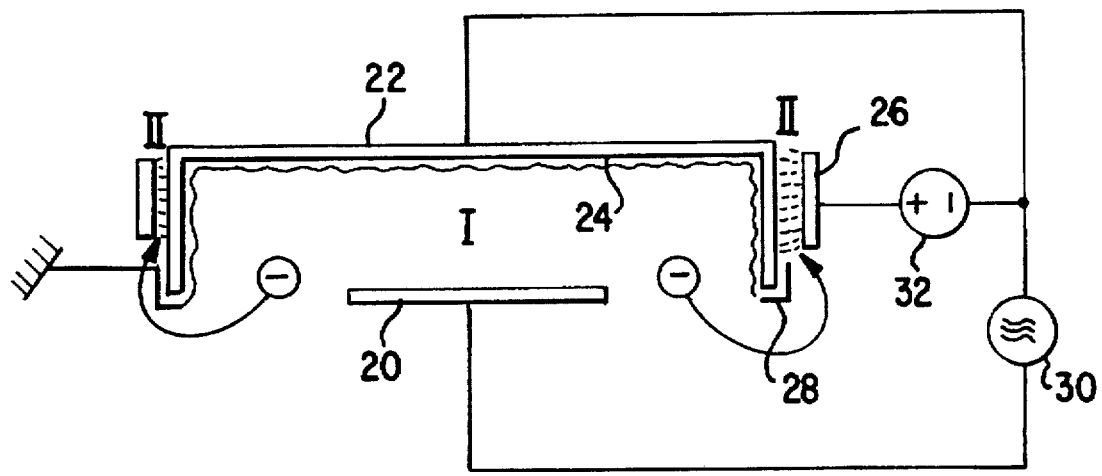
FIG. 3 shows schematically, the realization of the inventive process or principle at an inventive vacuum treatment chamber for Rf-sputtering.
Figure 4:
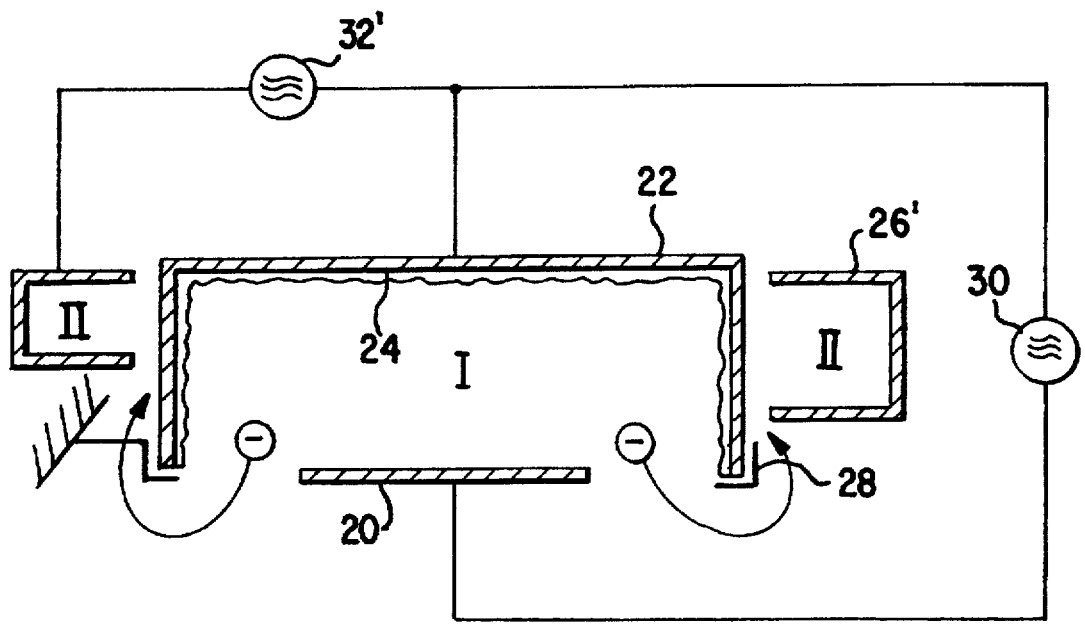
FIG. 4 shows schematically, a further embodiment of the principle, i.e. of an inventive treatment chamber or process or magnetron according to FIG. 3.
Figure 5:
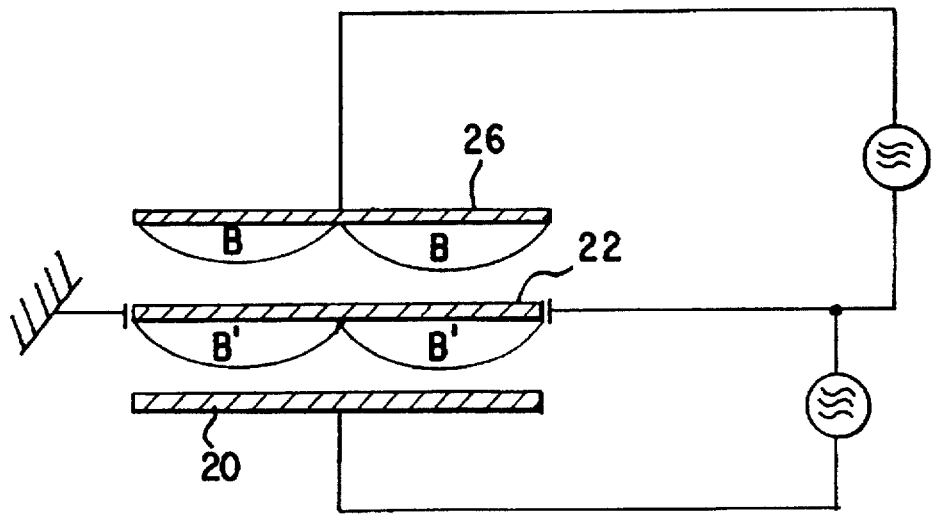
FIG. 5 shows schematically, an improved embodiment of the inventive vacuum treatment chamber according to FIG. 4, wherein deviations with respect to the surface law of "KOENIG" are exploited by applying magnetic fields.

In FIGS. 3 to 5, several embodiments are shown for realizing an inventive vacuum treatment chamber for Rf-sputtering. Thereby, we assume knowledge and understanding of the surface law according to KOENIG and of the possibilities to deviate the surface law of KOENIG by providing tunnel-shaped magnetic fields. We refer in this respect to DE-A-37 06 698.

According to FIG. 3, there is provided an Rf-generator 30 which is connected to the sputtering electrode 20 and to the counter electrode 22. By means of dark space shields 28, propagation of the plasma discharge to the reverse side of anode 22 is prevented. The dark space shield 28 nevertheless leaves a practically unobstructed or uncumbered transition path from primary discharge space I to the reverse side of anode 22. There, the third electrode 26 is arranged having a distance with respect to the reverse side of anode 22 which allows generation and maintenance of a plasma discharge. Preferably and with respect to the potential of anode 22, an anodic potential is applied to third electrode 26 by means of a DC-voltage source 32.

As in FIG. 2, in FIG. 3 also, the inner wall of the vacuum chamber is not shown because the wall is preferably used itself as the third electrode 26 which fact, nevertheless, does not change anything about the inventively exploited principle.

FIG. 4 shows analogously to FIG. 3, the arrangement if, instead of the DC-voltage source 32, an Rf-generator 32' is provided between the third electrode 26' and anode 22. In this case, in which the auxiliary discharge II is an Rf-discharge, so as to operate the third electrode 26' with respect to anode 22 at an anodic potential, the discharge effective surface area of the third electrode 26' is selected larger than the contamination-free anode surface area which is effective with respect to the auxiliary discharge II.

As was mentioned above, it is well-known that in Rf-sputtering by means of applying tunnel-shaped magnetic fields to the anode, the surface area of the anode may be significantly reduced practically to the same size as the sputtered cathode surface, thereby maintaining the anodic function. If this is exploited at the arrangement of FIG. 4, there results an arrangement as is schematically shown in FIG. 5 in which the reference numerals used correspond to the parts described with the same numerals in FIG. 4 and in which the letters B and B' represent the tunnel-shaped magnetic field.

Figure 6A:
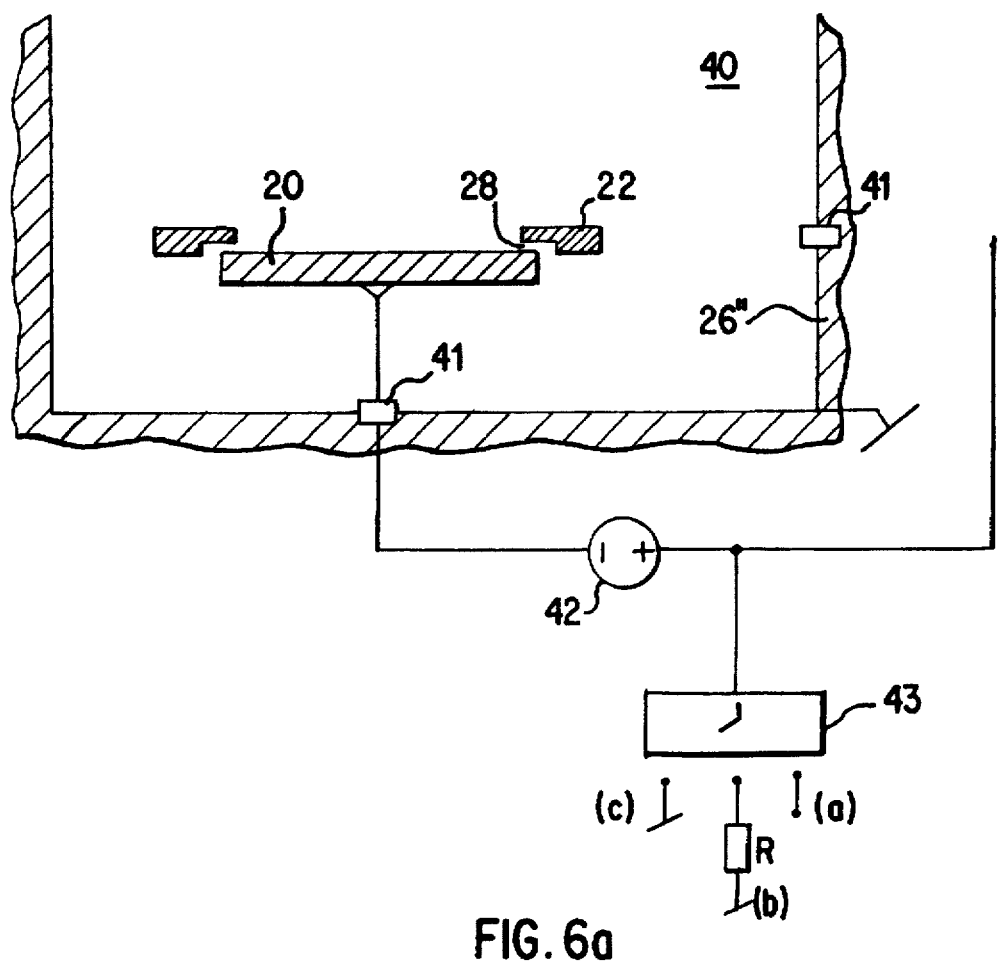
FIG. 6a shows schematically, a first embodiment of a preferred inventive DC-sputtering chamber, illustrating three possibilities of applying electric potentials thereto.
Figure 6B:
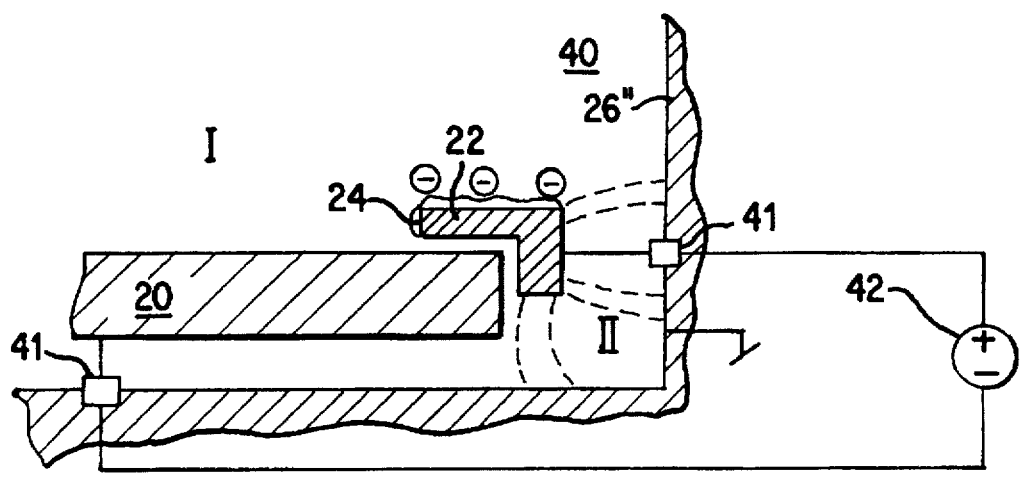
FIG. 6b shows schematically, an enlarged part of the cathode/anode arrangement of the embodiment according to FIG. 6a in one preferred embodiment of applying electric potential to explain the effect thereof.
Figure 6C:
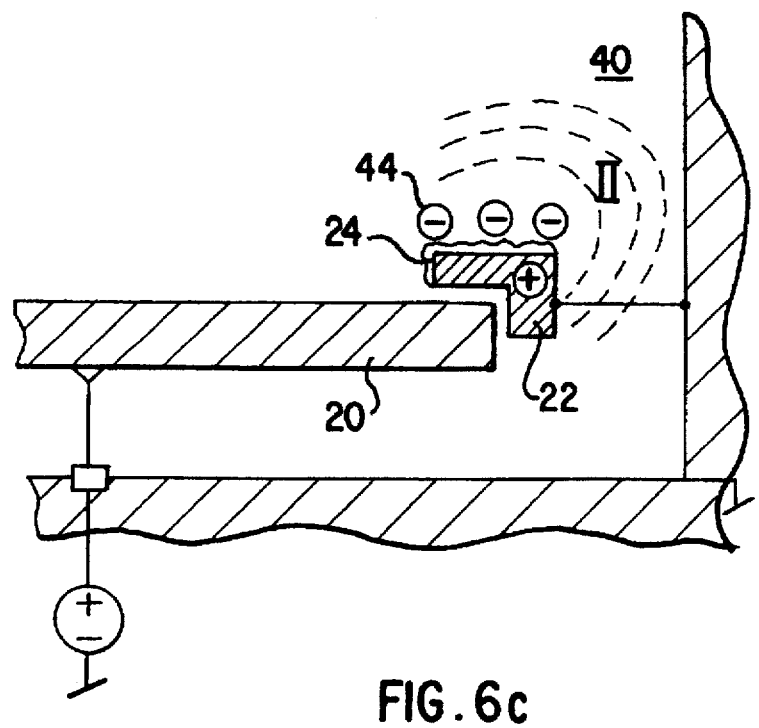
FIG. 6c shows for explaining the effect of a further embodiment of the arrangement according to FIG. 6a, an enlarged view of the cathode/anode area.
Figure 7:
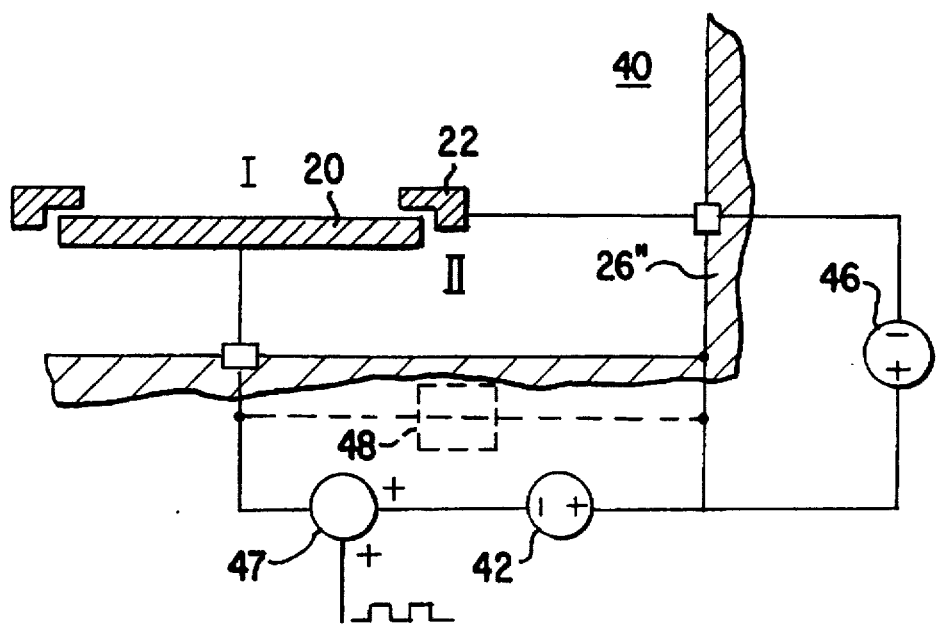
Figure 8:
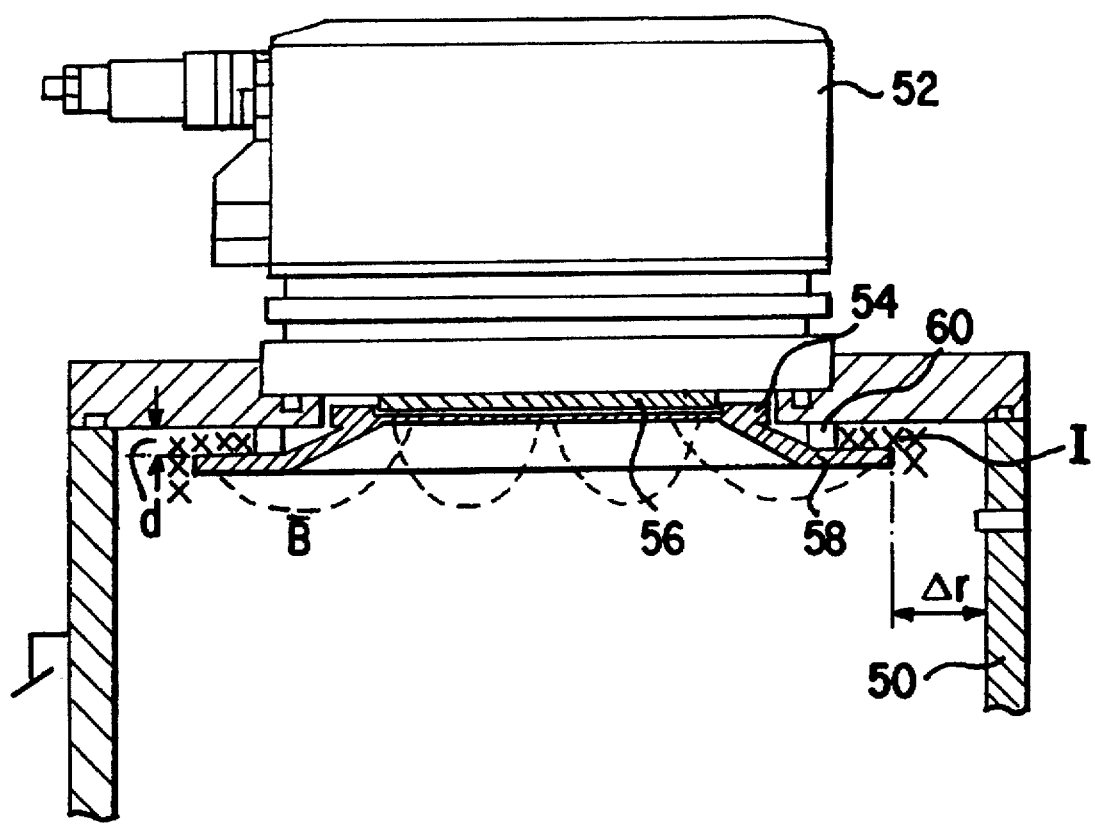
FIG. 8 shows a preferred embodiment of an inventive vacuum treatment chamber, partially in sectional representation.

By means of FIGS. 6 to 8, the preferred embodiment of the inventive vacuum treatment chamber and process, i.e. for DC-sputtering, shall be explained. First principal possibilities (a)-(c) are schematically shown in FIG. 6a. In the vacuum chamber 40, the cathode 20, which is preferably a magnetron cathode, is provided. The cathode 20 is electrically isolated from the chamber wall, as schematically shown by electrical insulator 41. The anode 22, shaped as a ring anode, provides with its downwards pointing surfaces the dark space shielding 28. The anode 22 is, as again schematically shown by means of electrical insulator 41, electrically isolated with respect to the wall of chamber 40. A DC-generator 42 is connected to cathode 20 and the anode 22. In this arrangement the inner wall of the chamber 40, designated with the reference number 26", acts as the third electrode described above. As schematically represented by the selector switch 43, the anode 22 may be applied with different electric potentials:

(a) Cathode 20 and anode 22 and thus generator 42 are electrically from to the third electrode 26".

(b) There is provided a resistance R between the anode 22 and third electrode 26".

(c) The anode 22 is at the potential of the third electrode 26" at the chamber 40 which is normally at referential potential, i.e. at ground potential.

In FIG. 6b, an enlarged section of the arrangement according to FIG. 6a is shown with an operation according to possibility (a). Due to the negative charge which deposits on the insulating deposit 24 on the anode 22, the plasma potential of the primary plasma discharge I is lowered with respect to the potential of the third electrode 26", which latter is normally ground potential. The auxiliary discharge II is generated between the free anode surface and the inside wall of the chamber, whereby the anode 22 acts, with respect to this auxiliary discharge II, as a cathode and tends therefore to be sputter-etched in this auxiliary discharge II.

As soon as the auxiliary discharge II has formed, with a plasma potential of about 30V, the primary discharge I with its anode and cathode is defined via the auxiliary discharge II with respect to ground potential of the third electrode 26", according to a potential difference of approximately the 30V. Due to safety consideration, especially considering operating conditions in which the auxiliary discharge II has not yet been established, i.e. at the very beginning of sputtering operation, it is preferred, according to possibility (b) shown in FIG. 6a, to provide the resistance R between anode 22 and the chamber wall 26". Thereby, the potential difference between the anode 22 and reference potential at the wall 26" of the chamber may not increase to a dangerous level before the auxiliary discharge II is established.

In FIG. 6c, the possibility according to (c) of FIG. 6a is shown. The metallic anode body of the anode 22 forms one plate of a capacitor which is created by the insulation deposit 24. The other plate of this capacitor is formed by the negative charge 44 deposited on the insulation deposit 24. The auxiliary discharge II is formed between the negative charge distribution 44 of charged particles with low mobility and the free areas of the anode 22. The third electrode is here, in fact, formed by the negative charge distribution 44 and deposit 44.

Referring back to FIG. 6a and considering the explanations with respect to FIGS. 6b and 6c, it becomes evident that by varying the value of the resistance R from zero to infinity, the two cases according to FIGS. 6b and 6c may be realized as extreme cases, and thus all cases therebetween can also be realized. Thereby, it must be considered that in every case, when one succeeds in generating an auxiliary discharge according to FIG. 6b before an auxiliary discharge according to FIG. 6c is generated, the latter auxiliary discharge will not be generated at all. Based on stability reasons, the possibility or embodiment according to (a) is preferred, and in consideration of safety reasons the embodiment according to (b) of FIG. 6a.

In the embodiment of FIG. 7, the anode 22 is operated with respect to the third electrode 26" by a separate specifically provided DC-generator 46, whereby the anode 22 is operated at a negative potential. Thereby, from the beginning of the sputtering process, the auxiliary discharge II is ignited, wherein the anode 22 acts as a cathode. In spite of the fact that this embodiment necessitates some additional components and may thus appear less optimal compared with the embodiments described before, it is this embodiment which is the best one with respect to sputtering process controllability.

In a preferred embodiment, a magnetron cathode is used as cathode 20. For maintaining control of problems due to sputter material or deposition material based contamination insulative depositions on the cathode 20, it is preferred to superimpose an AC-voltage as shown in FIG. 7 by reference number 47, thereby generating preferably a pulsating voltage. This is preferably realized, as shown in dashed lines at 48, by a chopper unit which bridges the DC-generator 42 and which provides for a low resistance charge exchange loop for the cathode 20, as is described in the U.S. application Ser. No. 08/020,672 and in EP-A-0 564 789 in greater detail. The operation of the chopper unit may be open-loop controlled or negative feedback controlled.

The plasma density in the auxiliary discharge II is preferably increased by a magnetic field.

FIG. 8 shows a current and approved inventive arrangement. At the chamber casing 50 acting as the third electrode, a planar magnetron source 52 of the type ARQ 100 produced by Balzers AG is mounted. A ring 54 surrounds the target 56 of the source 52 at a dark space distance and is operated at floating potential. It is also possible to integrate the ring 54 with the housing 50.

The anode 58 acting as counter electrode is mounted via electrically isolating supports 60 to the casing of the chamber and is positioned a dark space distance from the target. With respect to the casing 50, the anode 58 is an electrode for the auxiliary discharge II, where the surface of the anode 58 is kept free of contamination. B shows schematically the magnetic field and especially the stray field of the magnetron source 52. The stray field penetrates through the anode 58, thus generating a significant magnetic field within the space for the auxiliary discharge between the anode 58 and the casing of the chamber 50.

EXAMPLE

The anode was connected according to possibility (b) of FIG. 6a with the resistance R=1k$\Omega$. The radial distance ar from anode 58 to casing 50 was approximately 80 mm.

The distance d between the reverse side of the anode and the casing was approximately 10 mm to 15 mm. The wall or casing of the chamber was connected to ground potential. With this magnetron source, the strength of the magnetic fields within the auxiliary discharge space with the distance d was 100 G.

The inventive chamber was operated as follows:

| | |
|---|---|
| Power of magnetron: | 2 kW to 4 kW; |
| Discharge voltage for the primary discharge between target 56 and anode 58: | −400 V to 600 V in the metallic sputter mode, −200 V to 330 V in the reactive sputter mode; |
| Argon pressure: | 4 · 10$^{-3}$ mbar to 8 · 10$^{3}$ mbar; |
| Reactive gas: | $O_2$, $N_2$ |
| Oxygen pressure: | 2 · 10$^{-3}$ mbar; |
| Nitrogen pressure: | 3 · 10$^{-3}$ mbar; |
| Distance of sputter coated substrates from target: | 70 mm. |

The voltage between ground potential and negative anode 58 was between 0V and 100V, whereby by appropriately adjusting or selecting the value of resistance R, operation was set to 20V to 40V.

The following operating conditions are preferred:

Magnetron

Usual and typical strength of magnetic field, measured parallel to the new target surface to be sputtered just above the target surface and with respect to the center of the target in radial direction: typically 150 G to 700 G, preferably 150G to 400 G.

Range of Operating Pressure

As the range of total pressure in the chamber we prefer a pressure between 1×10$^{-3}$ mbar to 1×10$^{-1}$ mbar.

Constitution of the Auxiliary Discharge Space

Along the auxiliary discharge space the smallest distances x of rigid surfaces limiting this space are:

$1\lambda_f \leq x \leq 15\lambda_f$

Preferably this distance x is made not more than 5$\lambda_f$

In the above $\lambda_f$ stands for the mean free path of the molecules of the working gas at the above mentioned pressure conditions.

This leads to a minimal three-dimensional extent of the auxiliary discharge space of typically 5 mm to 50 mm, preferably of 5 mm to 30 mm, and even more preferably from 10 mm to 25 mm. This dimension designates, as was mentioned before, the shortest distance between rigid surfaces limiting or defining the auxiliary discharge space.

Auxiliary Magnetic Field

As was mentioned above, the auxiliary magnetic field across the auxiliary discharge space may be realized by a magnet arrangement which is specially provided for such auxiliary discharge space. The magnetic field in the auxiliary discharge space may, on the other hand, be generated by the stray field of a magnetron arrangement. The magnetic field strength has a value of at least one area in the auxiliary discharge space, which is preferably more than 10 G and up to the maximum magnetic field strength of the magnetron. Preferably, the magnetic field strength, nevertheless, has a value at at least one area between the electrodes defining or confining the auxiliary discharge space which is not more than 50% of the magnetron magnetic field as a maximum value.

$SiO_2$, $TiO_2$ and SiNlayers were deposited with relatively high deposition rates of 46 Å/sec in the metallic mode with a source power of 2 kW for $SiO_2$ and with a rate of 22 Å/sec in the metallic mode and with 2 kW source power as well for SiN-layers. The sputter layer deposition process was stable from the beginning in the metallic as well as in the reactive mode. That is, the auxiliary plasma discharge II was formed from the beginning of sputtering operation.

We claim:

1. A sputtering apparatus for operating in a predetermined pressure range and comprising a sputtering electrode and a counter electrode, wherein said sputtering electrode and said counter electrode are mutually electrically driven and mutually geometrically located so as to generate a stable sputtering plasma discharge in a primary plasma discharge space between said sputtering electrode and said counter electrode and at a selected pressure of said pressure range; an electrode surface of said counter electrode not being visible from said sputtering electrode; and further comprising a third electrode facing said electrode surface of said counter electrode, wherein said electrode surface and said third electrode are mutually electrically driven and mutually geometrically located so as to generate a stable auxiliary plasma discharge at said selected pressure in an auxiliary plasma discharge space between said electrode surface and said third electrode so as to form a high conductivity connection between said auxiliary plasma discharge space and said primary plasma discharge space.

2. The apparatus of claim 1, wherein said counter electrode surrounds said sputtering electrode remote therefrom at a dark space distance and wherein the shortest distance between said not visible surface area and said third electrode is larger than said dark space distance.

3. The apparatus of claim 1, wherein said third electrode is either electrically supplied or dimensioned with respect to said counter electrode so that said counter electrode forms a cathode with respect to said third electrode.

4. The apparatus of claim 1, wherein said third electrode is either mounted electrically insulated from said counter electrode and connected to said counter electrode via an ohmic resistance or is directly connected to said counter electrode.

5. The apparatus of claim 1, wherein said third electrode is formed by sputtering operation of the counter electrode.

6. The apparatus of claim 1, wherein said counter electrode is connected to said third electrode via a voltage source.

7. The apparatus of claim 1, wherein said third electrode is formed by at least a part of the inner wall of said chamber.

8. The apparatus of claim 1, wherein said sputtering electrode is configured to be operated with respect to said counter electrode by a DC-generator or a generator of a pulsating DC-voltage.

9. The apparatus of claim 1, wherein said sputtering electrode and said counter electrode are connected to a DC-generator via a chopper unit.

10. The apparatus of claim 9, wherein said chopper unit is a chopper unit operating parallel to the primary plasma discharge space.

11. The apparatus of claim 1, wherein the inside of said chamber is connected via a gas feed arrangement to a gas tank arrangement for supplying a reactive gas.

12. The apparatus of claim 1, wherein said sputtering electrode is a part of a magnetron sputtering source.

13. The apparatus of claim 1, wherein a magnet arrangement is provided generating a magnetic field in said auxiliary discharge space.

14. The apparatus of claim 13, wherein said sputtering electrode is part of a magnetron sputtering source and wherein the magnetic stray field of said magnetron sputtering source generates said magnetic field in said auxiliary discharge space.

15. A vacuum sputtering process, wherein a material with low conductivity is deposited, comprising the steps of:

generating a primary stable plasma discharge in a primary plasma discharge space between a sputtering electrode and a counter electrode within a vacuum chamber, and at a selected pressure within a predetermined pressure range arranging at least one surface area of said counter electrode so as not to be visible from said sputtering electrode and, electrically interconnecting said at least one surface area of said counter electrode with said plasma discharge by an auxiliary stable plasma discharge generated at said selected pressure in an auxiliary plasma discharge space to form a high conductivity connection between said auxiliary plasma discharge space and said primary plasma discharge space.

16. The process of claim 15, wherein the sputtered surface of said sputtering electrode consists of a material with a lower electric conductivity than that of metal.

17. A magnetron arrangement, comprising an electrode to be sputtered and a counter electrode arranged with respect to each other so as to generate a stable sputtering plasma discharge in a primary plasma discharge space and at a selected pressure within a predetermined pressure range, said counter electrode comprising at least one surface area which is not visible from said electrode to be sputtered, and a third electrode forming with said at least one surface area an auxiliary plasma discharge space in which an auxiliary plasma discharge is generated at said selected pressure to form a high conductivity connection between said primary and auxiliary plasma discharge spaces.

18. The magnetron arrangement of claim 17, wherein a magnetic stray field of said magnetron arrangement penetrates said auxiliary plasma discharge space.

19. The magnetron arrangement of claim 17, wherein there is provided a separate magnet arrangement generating a magnetic field primarily in said auxiliary plasma discharge space.

* * * * *